United States Patent
Morgan et al.

(10) Patent No.: US 7,003,045 B2
(45) Date of Patent: Feb. 21, 2006

(54) METHOD AND APPARATUS FOR ERROR CORRECTION

(75) Inventors: William K. Morgan, Elgin, IL (US); Lee M. Proctor, Cary, IL (US); Nai Sum Wong, Palatine, IL (US); Mark D. Hetherington, Crystal Lake, IL (US)

(73) Assignee: Motorola, Inc., Schaumburg, IL (US)

( * ) Notice: Subject to any disclaimer, the term of this patent is extended or adjusted under 35 U.S.C. 154(b) by 733 days.

(21) Appl. No.: 09/774,893

(22) Filed: Jan. 31, 2001

(65) Prior Publication Data
US 2002/0141507 A1    Oct. 3, 2002

(51) Int. Cl.
H03M 13/03 (2006.01)
H04L 5/12 (2006.01)
H04L 23/02 (2006.01)

(52) U.S. Cl. .................... 375/265; 714/792
(58) Field of Classification Search ......... 375/262, 375/265, 340, 341; 714/786, 792, 794, 795
See application file for complete search history.

(56) References Cited

U.S. PATENT DOCUMENTS

| | | |
|---|---|---|
| 5,751,725 A | 5/1998 | Chen |
| 5,978,414 A | 11/1999 | Nara |
| 6,097,716 A * | 8/2000 | Abrishamkar ............ 375/341 |
| 6,400,731 B1 * | 6/2002 | Nitta ........................ 714/795 |
| 6,530,059 B1 * | 3/2003 | Crozier et al. ........... 714/786 |

\* cited by examiner

Primary Examiner—Betsy L. Deppe
(74) Attorney, Agent, or Firm—Kenneth A. Haas; Steven A. May

(57) ABSTRACT

A convolutional encoder (112) comprises a controller (201), having a transmission rate (e.g. frame rate) as an input. The controller (201) initializes the encoder (112) to an initial state based on a transmission rate currently being utilized. When decoding, a decoder (300) utilizes a Trellis diagram having an initial and final state based upon the frame rate.

17 Claims, 6 Drawing Sheets

METHOD AND APPARATUS FOR ERROR CORRECTION

FIELD OF THE INVENTION

The present invention relates generally to communication systems and in particular, to a method and apparatus for error correction within such communication systems.

BACKGROUND OF THE INVENTION

Within a Code Division Multiple Access (CDMA), and other communication system types, communicated information, either voice or data, is carried between communication resources, e.g., a radio telephone and a base station, on a communication channel. Within broadband, spread spectrum communication systems, such as CDMA based communication systems in accordance with Interim Standard IS-95B, a spreading code is used to define the communication channel.

CDMA systems have the capability of transmitting user information at variable rates. For example in voice calls the data rate of each speech frame is varied based on the speech activity. When a user is speaking, compressed speech information is typically sent at full rate. Between words and sentences the data rate is typically reduced to eighth rate. Half and quarter rates are also used for speech to quiet transitions and when data rate reductions are required, such as to allow for multiplexing of signaling information or to increase system capacity. In data services calls, full, half, quarter and eighth rate frames can be selected based on the data rate of the user requested information.

In CDMA communication systems the receiver does not know apriori the data rate of a received frame. The receiver has to apply the decoding mechanism for each of the allowable frame rates, and look at certain characteristics of the received data frames to determine the probable frame rate that the frame was transmitted at. Characteristics that are usually employed are Symbol Error Rate (SER), CRC verification and Viterbi decoder Quality bits. SER is an estimate of the number of symbol errors in the convolutionally coded data that is obtained by re-encoding the information sequence recovered by convolutional decoding and accumulating the number of re-encoded channel symbols found to be different from the received symbols. Some of the frame rates, namely full and half rate for IS-95, are protected by a CRC codeword. These are generated by the transmitter by performing a type of degenerate cyclic coding on the data. The resulting CRC is convolutionally encoded and transmitted with the data. The receiver also generates the CRC of the received convolutionally decoded data, and compares it with the CRC appended by the transmitter. Viterbi decoders are typically used for convolutional decoding. In addition to the data sequence they sometimes provide a Quality bit indication that indicate whether a decoded sequence deviated excessively from a valid data sequence.

The decision as to what rate was employed by the transmitter is typically performed by the receiver's Rate Determination Algorithm (RDA). Although RDAs typically do a good job of distinguishing between frame rates they are still subject to falsing. For example, a frame that was transmitted as an eighth rate frame can be incorrectly interpreted by the receiver as a full rate frame. The effects of these mis-determined rates can be severe, sometimes resulting in severe audio artifacts in voice calls and a reduction in data throughput for data calls.

The forward error correcting (FEC) protocols used in IS-95 and known in the art have also been found to contribute to falsing. In particular, FEC techniques have been shown to be non-optimal in providing adequate code distance between a transmitted sub-rate frame and the nearest possible fill rate frame. For example, when presented with silence, the Enhanced Variable Rate Codec (EVRC) used in CDMA systems has been observed to converge on the 16 bit eighth rate frame 0740H, and repeat this frame over and over. Simulations of the IS-95 FEC scheme shows that this eighth rate when passed through the eighth rate convolutional encoder and data repeater, could be decoded by a full rate decoder with a very low SER. When the encoded frame is punctured by power control bits and suffers a few bit errors on the air interface it has been observed that the CRC can also pass. Therefore, a need exists for a method and apparatus for FEC that reduces falsing within a communication system.

DETAILED DESCRIPTION OF THE DRAWINGS

To address the need for forward error correction within a communication system, a convolutional encoder/decoder is provided herein. The convolutional encoder comprises controller, having a transmission rate (e.g. frame rate) as an input. The controller initializes the encoder to an initial state based on a transmission rate currently being utilized. When decoding, a decoder utilizes a Trellis diagram having an initial and final state based upon the frame rate.

Since the initial state of the encoder is different for all possible data rates, the probability of falsing is greatly reduced. More particularly, the hamming distances are significantly increased between valid encoded sequences for one transmission rate and the valid encoded sequences for another transmission rate. This increase in the hamming distance improves the likelihood of correctly decoding the frame.

The present invention encompasses a method for encoding data within a communication system. The method comprises the steps of receiving a data rate and setting an initial state of a convolutional encoder based on the data rate.

The present invention additionally encompasses a method for decoding data within a communication system, the method comprising the steps of receiving data, setting an initial state of a Trellis diagram based on a data rate, and utilizing the Trellis diagram to decode the data.

The present invention additionally encompasses a convolutional encoder comprising a controller having a rate as an input and outputting an initial state of the encoder based on the rate.

The present invention additionally encompasses an apparatus comprising means for decoding input data utilizing a Trellis diagram having an initial and a final state based on a transmission rate.

Figure 1:
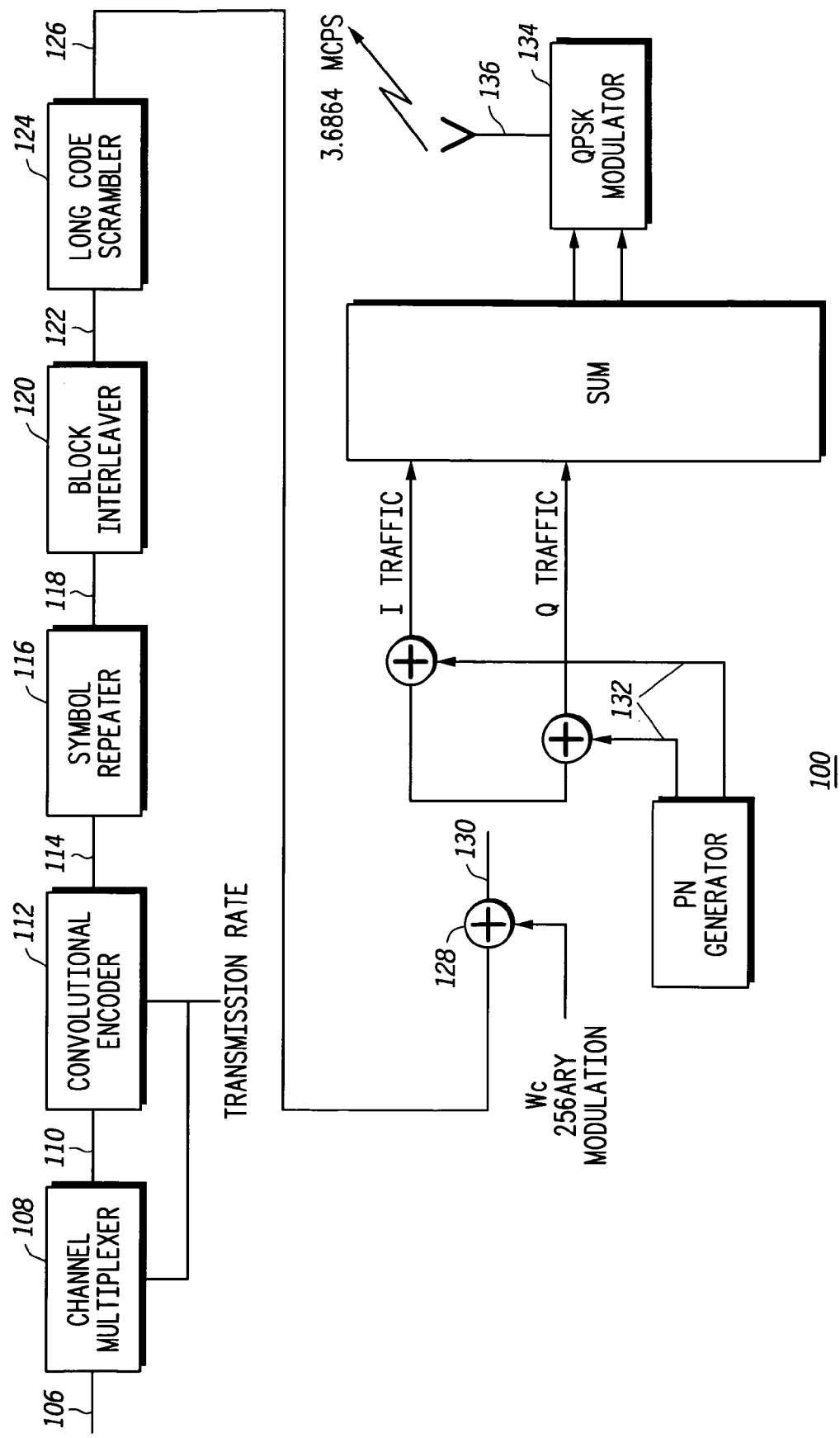
FIG. 1 is a block diagram of a transmitter in accordance with the preferred embodiment of the present invention.

Turning now to the drawings, wherein like numerals designate like components, FIG. 1 is a block diagram of base station 100 in accordance with the preferred embodiment of the present invention. In the preferred embodiment of the present invention base station 100 In the preferred embodiment of the present invention, communication system 100 utilizes a direct-sequence Code Division Multiple Access (CDMA) system protocol as described in Cellular System Remote unit-Base Station Compatibility Standard of the Electronic Industry Association/Telecommunications Industry Association Interim Standard 95C (TIA/EIA/IS-95C). However, in alternate embodiments communication system 100 may utilize other digital cellular communication system protocols such as, but not limited to, the next generation CDMA architecture as described in the UMTS Wideband cdma SMG2 UMTS Physical Layer Expert Group Tdoc SMG2 UMTS-L1 222/98 (JMTS 222/98), the next generation CDMA architecture as described in the cdma2000 International Telecommunication Union-Radiocommunication (ITU-R) Radio Transmission Technology (RTT) Candidate Submission document, or the CDMA system protocol as described in "Personal Station-Base Station Compatibility Requirements for 1.8 to 2.0 GHz Code Division Multiple Access (CDMA) Personal Communication Systems" (American National Standards Institute (ANSI) J-STD-008), or the European Telecommunications Standards Institute (ETSI) Wideband CDMA (W-CDMA) protocol. The present invention is also applicable to direct-sequence spread spectrum systems which utilize code selection techniques to convey information. For example, user information may be transmitted via the particular selection of a plurality of n orthogonal waveforms from a larger plurality of N orthogonal waveforms. The present invention is applicable to both the forward and reverse transmission paths of these communication systems.

During operation, signal 106 (traffic channel data bits) is received by channel multiplexer 108 at a particular bit rate (e.g., 8.6 kbit/second). Input traffic channel data 106 bits typically include voice converted to data by a vocoder, pure data, or a combination of the two types of data. Channel multiplexer 108 multiplexes secondary traffic (e.g., data, tail bits, . . . etc.), and/or signaling traffic (e.g. control or user messages) onto the traffic channel data 106 and outputs multiplexed data 110 at 9.6 kbit/sec to convolutional encoder 112. Convolutional encoder 112 encodes input data bits 110 into data symbols at a fixed encoding rate with an encoding algorithm which facilitates subsequent maximum likelihood decoding of the data symbols into data bits (e.g. convolutional or block coding algorithms). For example, convolutional encoder 112 encodes input data bits 110 (received at a rate of 9.6 kbit/second) at a fixed encoding rate of one data bit to two data symbols (i.e., rate ½) such that convolutional encoder 112 outputs data symbols 114 at a 19.2 ksymbol/second rate.

Data symbols 114 are then input into symbol repeater 116 where the individual symbols are repeated in accordance with their transmission rate (e.g., full, half, quarter, or $8^{th}$). Repeated symbols 118 exit repeater 116 and enter interleaver 120. Interleaver 120 interleaves the input symbols 118 at the symbol level. In interleaver 120, data symbols 118 are individually input into a matrix which defines a predetermined size block of data symbols 118. Data symbols 118 are input into locations within the matrix so that the matrix is filled in a column by column manner. Data symbols 118 are individually output from locations within the matrix so that the matrix is emptied in a row by row manner. Typically, the matrix is a square matrix having a number of rows equal to the number of columns; however, other matrix forms can be chosen to increase the output interleaving distance between the consecutively input non-interleaved data symbols. Interleaved data symbols 122 are output by interleaver 120 at the same data symbol rate that they were input (e.g., 19.2 ksymbol/second). The predetermined size of the block of data symbols defined by the matrix is derived from the maximum number of data symbols which can be transmitted at a predetermined symbol rate within a predetermined length transmission block. For example, if the predetermined length of the transmission block is 20 milliseconds, then the predetermined size of the block of data symbols is 19.2 ksymbol/second times 20 milliseconds which equals 384 data symbols which defines a 16 by 24 matrix.

Interleaved data symbols 122 are input to long code scrambler 124 where symbols 122 are scrambled by a long code. The scrambled symbols 126 enter orthogonal encoder 128. Orthogonal encoder 128 modulo 2 adds an orthogonal code (e.g., a 64-ary Walsh code) to each interleaved and scrambled data symbol 126. For example, in 64-ary orthogonal encoding, interleaved and scrambled data symbols 126 are each replaced by a 64 symbol orthogonal code or its inverse. These 64 orthogonal codes preferably correspond to Walsh codes from a 64 by 64 Hadamard matrix wherein a Walsh code is a single row or column of the matrix. Orthogonal encoder 128 repetitively outputs a Walsh code or its inverse which corresponds to input data symbol 26 at a fixed symbol rate (e.g., 19.2 ksymbol/second).

The sequence of Walsh codes 130 are scrambled by a pair of short pseudorandom codes 132 (i.e. short when compared to the long code) to generate an I-channel and Q-channel code spread sequence. The I-channel and Q-channel code spread sequences are used to bi-phase modulate a quadrature pair of sinusoids by driving the power level controls of the pair of sinusoids. The sinusoids output signals are summed, bandpass filtered, translated to an RF frequency, amplified, filtered via modulator 134 and radiated by an antenna 136 to complete transmission of the channel data bits 110.

Figure 2:
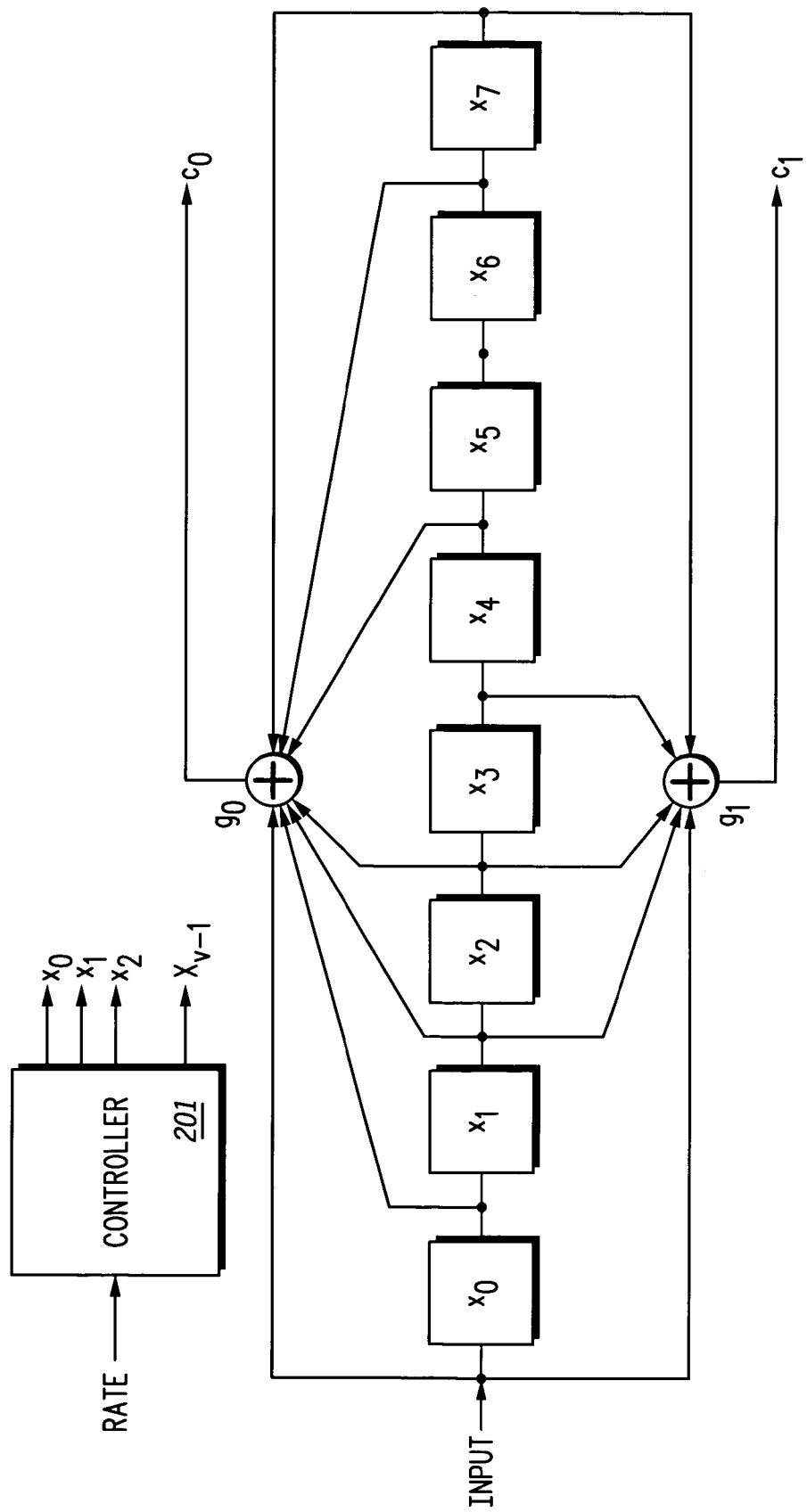
FIG. 2 is a block diagram of the convolutional encoder of FIG. 1 in accordance with the preferred embodiment of the present invention.

FIG. 2 is a block diagram of convolutional encoder 112 in accordance with the preferred embodiment of the present invention. The memory of encoder 12 is characterized by its state, which is represented as a v-bit binary number $X=x_0 x_1 \ldots x_{v-1}$. For every m input bits, the encoder outputs n bits based on the m input and v state bits, and then transitions to a next state. More particularly, for every bit that enters the encoder, that bit is stored in the leftmost memory location, and all pre-stored bits are shifted to the right. Two calculations ($g_o$ and $g_1$) are made each bit time by exclusive Or'ing the contents of the specified shift register locations as shown.

In the preferred embodiment of the present invention encoder 112 comprises controller 201, having a transmission rate (e.g. frame rate) as an input. Controller 201 initializes encoder 112 to an initial state based on a transmission rate currently being utilized. More particularly, prior-art encoders are typically initialized to the all-zero state, i.e., X=0000 . . . 0.In the preferred embodiment of the present invention a different initial state is utilized for each transmission rate. For example, in one embodiment, an IS2000 convolutional encoder of length K=9 has $2^{(K-1)}$ states to choose from. Encoder 112 is initialized to X=01010111 for full rate, X=10101010 for half rate, X=101100110 for quarter rate, and X=10101011 for eighth rate. Tail bits are inserted by multiplexer 108 at the end of each frame of data to force encoder 112 back to a known final state. More particularly, the tail bits are added to "chain back" encoder 112 to a state that is dependent upon a data rate. In the preferred embodiment the final state is the same as the initialization state, however, in alternate embodiments, the final state may be a state other than the initial state.

Since the initial state of encoder 112 is different for all possible data rates, the probability of falsing is greatly reduced. More particularly, the hamming distances are significantly increased between valid encoded sequences for one transmission rate and the valid encoded sequences for another transmission rate. This increase in the hamming distance improves the likelihood of correctly decoding the frame.

Figure 3:
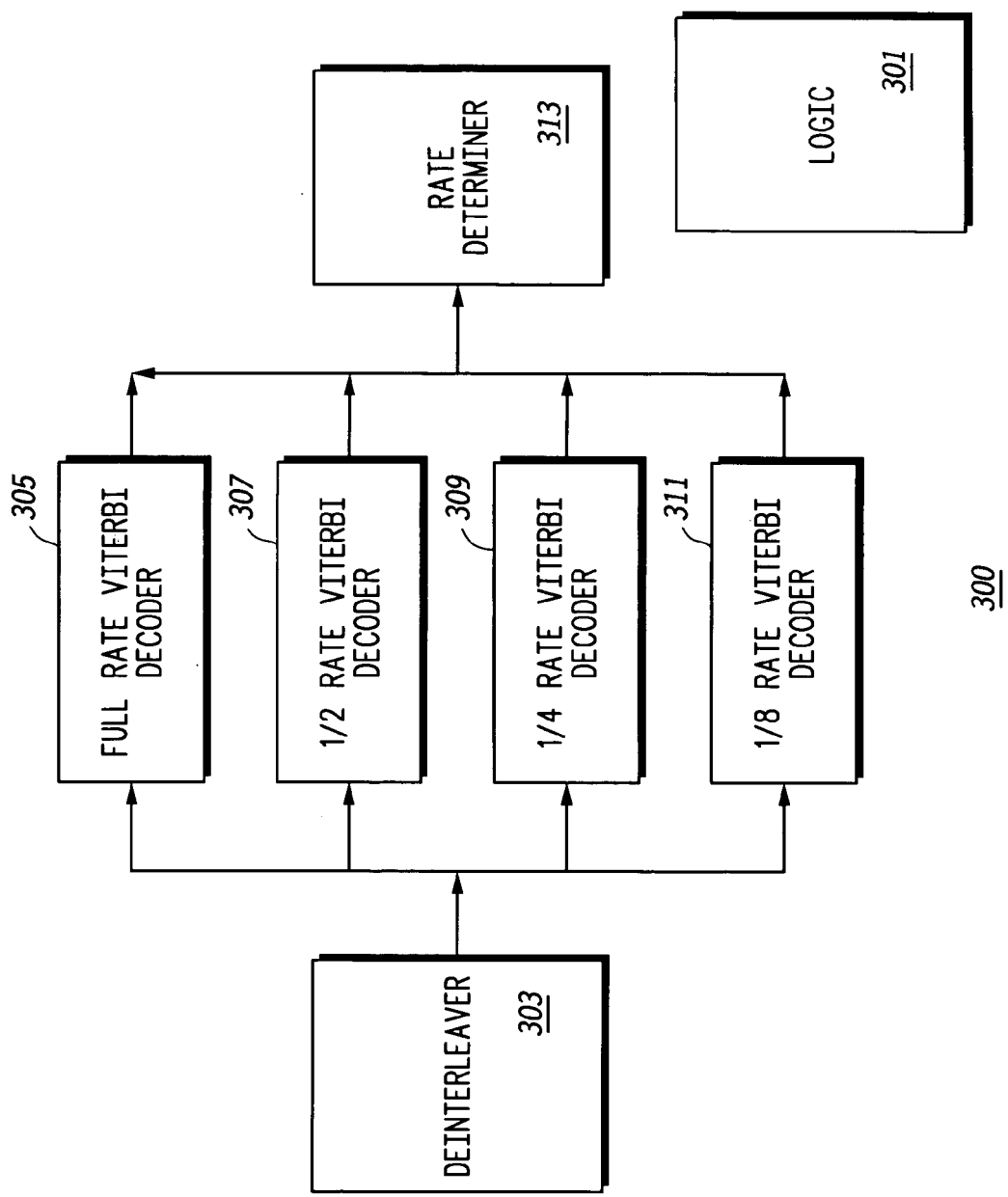
FIG. 3 is a block diagram of a decoder in accordance with the preferred embodiment of the present invention.

FIG. 3 is a block diagram of convolutional decoder 300 in accordance with the preferred embodiment of the present invention. Because the data rate of a transmitted signal is not known apriori, the decoder utilizes several decoders 305–311 for decoding the data and determining the appropriate data rate. More particularly, the decision as to what rate was employed by the transmitter is typically performed by the receiver's rate determiner 313 utilizing a Rate Determination Algorithm (RDA). Decoders 305–311 pass metrics, or decoding characteristics to determiner 313 and determiner 313 uses the decoding characteristics from each decoder 305–311 to determine what rate the received frame was transmitted at and/or whether the frame is useable. If the frame contains too many bit errors or its rate cannot be determined the frame is declared an erasure. A RDA will typically have a series of rules that it follows to determine the rate. For example some such rules could be IF $CRC_{full}$==TRUE AND $SER_{full}$<=$SER_{fullthreshold}$
  THEN FRAME_RATE=FULL
IF $CRC_{full}$==FALSE AND $SER_{full}$>$SER_{fullthreshold}$
  AND $CRC_{half}$==FALSE AND $SER_{half}$>$SER_{halfthreshold}$
  AND $SER_{eight}$<$SER_{eighthreshold}$
  THEN FRAME_RATE=EIGHTH Where $CRC_x$ is the Cyclic Redundancy Check result for a particular rate;

$SER_x$ is Symbol Error Rate for a particular rate; and $SER_{xthreshold}$ is an $SER_x$ comparison threshold.

Figure 4:
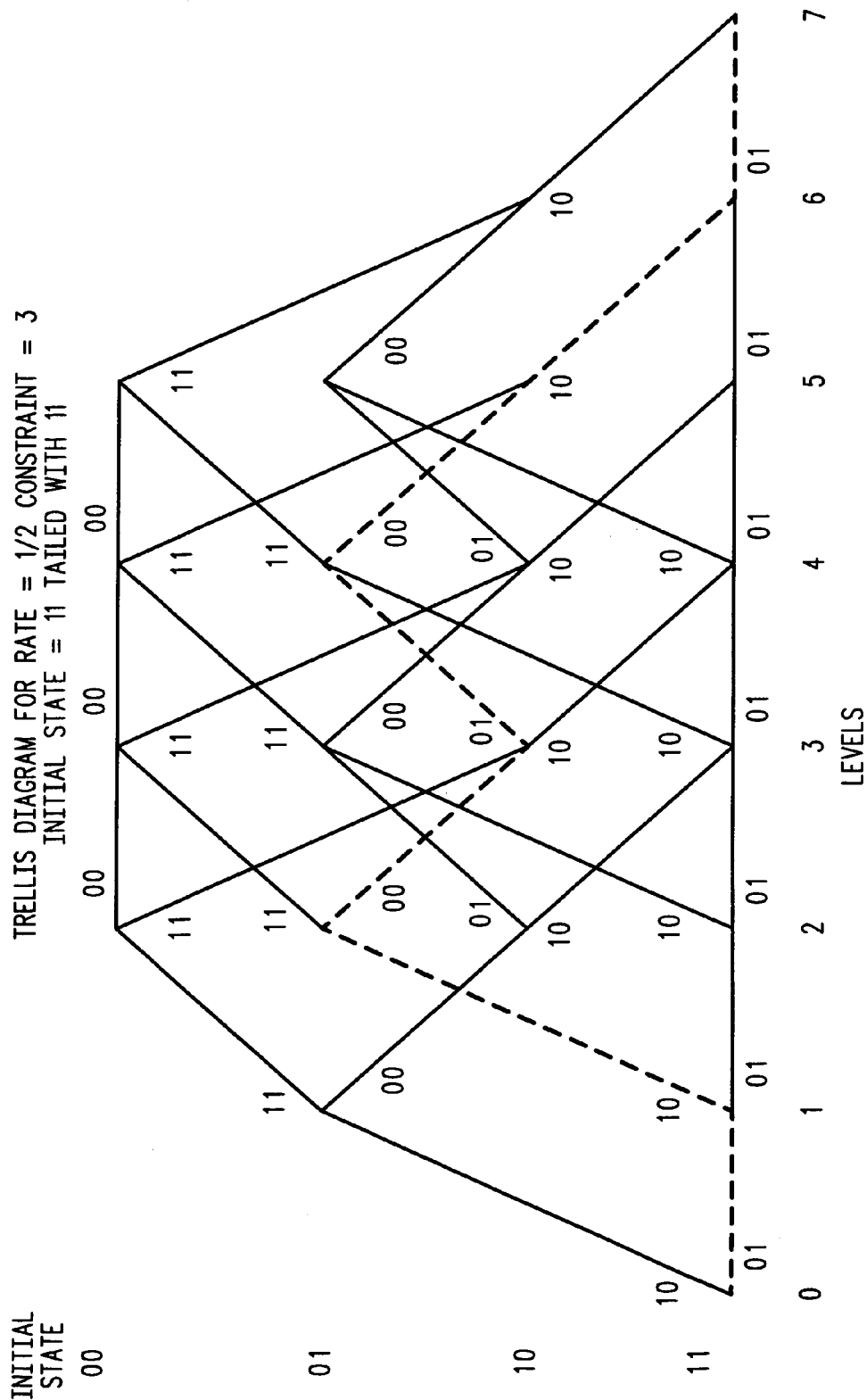
FIG. 4 is an illustration of a Trellis Diagram in accordance with the preferred embodiment of the present invention.

In decoding the data for various transmission rates, a Viterbi Algorithm is utilized as described in Digital Communications Fundamentals and Applications, N.J., Prentice Hall, 1988. More particularly, each decoder (i.e., $8^{th}$ Rate, ½ Rate, and Full Rate) utilizes a Viterbi Algorithm to decode incoming data. As provided by Viterbi, a Trellis diagram is utilized to simplify decoding. A simplified Trellis diagram is shown in FIG. 4. As one of ordinary skill in the art will recognize, path metrics are determined from an initial state to a final state along the trellis diagram. In the preferred embodiment of the present invention, the initial and final state of the Trellis diagram is based on transmit rate. For example, in one embodiment, an IS2000 convolutional encoder of length K=9 has $2^{(K-1)}$ states to choose from. Decoders 305–311 set the initial and final states of the Trellis to X=01010111 for full rate, X=10101010 for half rate, X=01100110 for quarter rate, and X=10101011 for eighth rate.

Figures 5, 6:
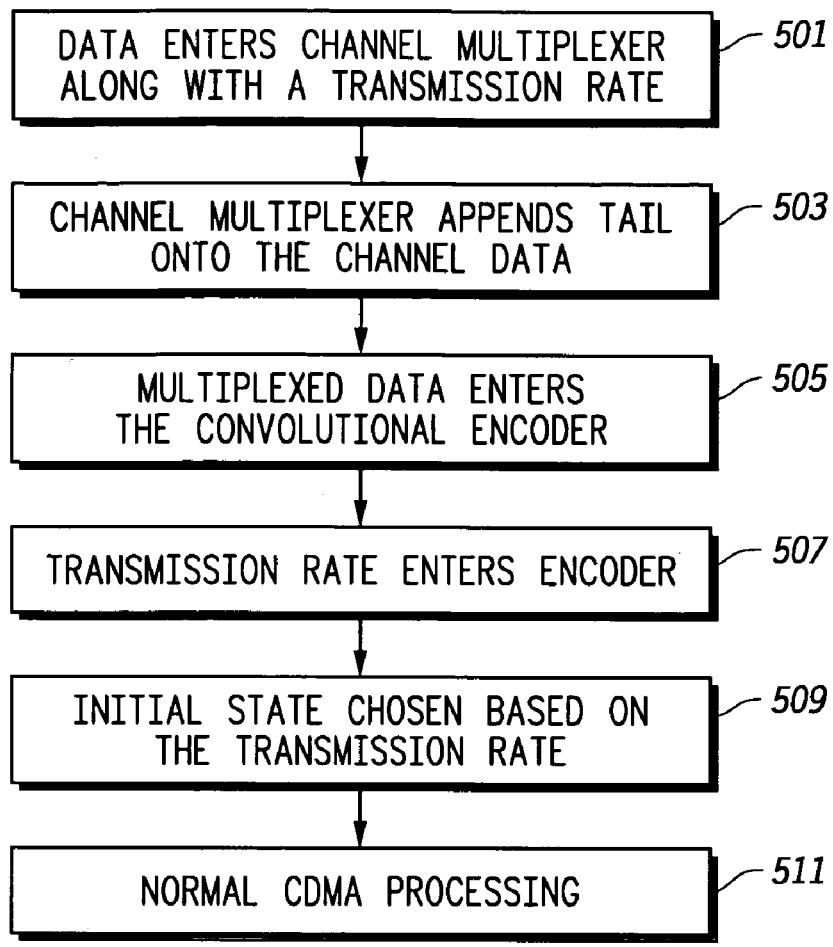
FIG. 5 is a flow chart showing operation of the convolutional encoder of FIG. 1 in accordance with the preferred embodiment of the present invention.
FIG. 6 illustrates the appending of tail bits in accordance with the preferred embodiment of the present invention.

FIG. 5 is a flow chart showing operation of the convolutional encoder of FIG. 1 in accordance with the preferred embodiment of the present invention. The logic flow begins at step 501 where data 106 enters channel multiplexer 108 along with a transmission rate. In the preferred embodiment of the present invention channel multiplexer appends tail bits onto the channel data in order to "chain back" convolutional encoder 112 to an initial state (step 503). As discussed above, the tail bits are a v-bit binary number $X=x_o x_1 \ldots x_{v-1}$ that is dependent upon the transmit rate (i.e., full, half, quarter, or eighth). Such tail bits are illustrated in FIG. 6. As shown tail bits 10101010 have been appended to the data.

Continuing, at step 505 multiplexed data 110 enters convolutional encoder 112. Convolutional encoder 112 convolutionally encodes multiplexed data 110 as discussed above. In particular, at step 507 a transmission rate enters convolutional encoder 112. Controller 201 analyzes the transmission rate and chooses an initial state based on the transmission rate (step 509). At step 511, normal CDMA channel processing takes place.

As discussed above, since the initial state of encoder 112 is different for all possible data rates, the probability of falsing is greatly reduced. More particularly, the hamming distances are significantly increased between valid encoded sequences for one transmission rate and the valid encoded sequences for another transmission rate. This increase in the hamming distance improves the likelihood of correctly decoding the frame.

Figure 7:
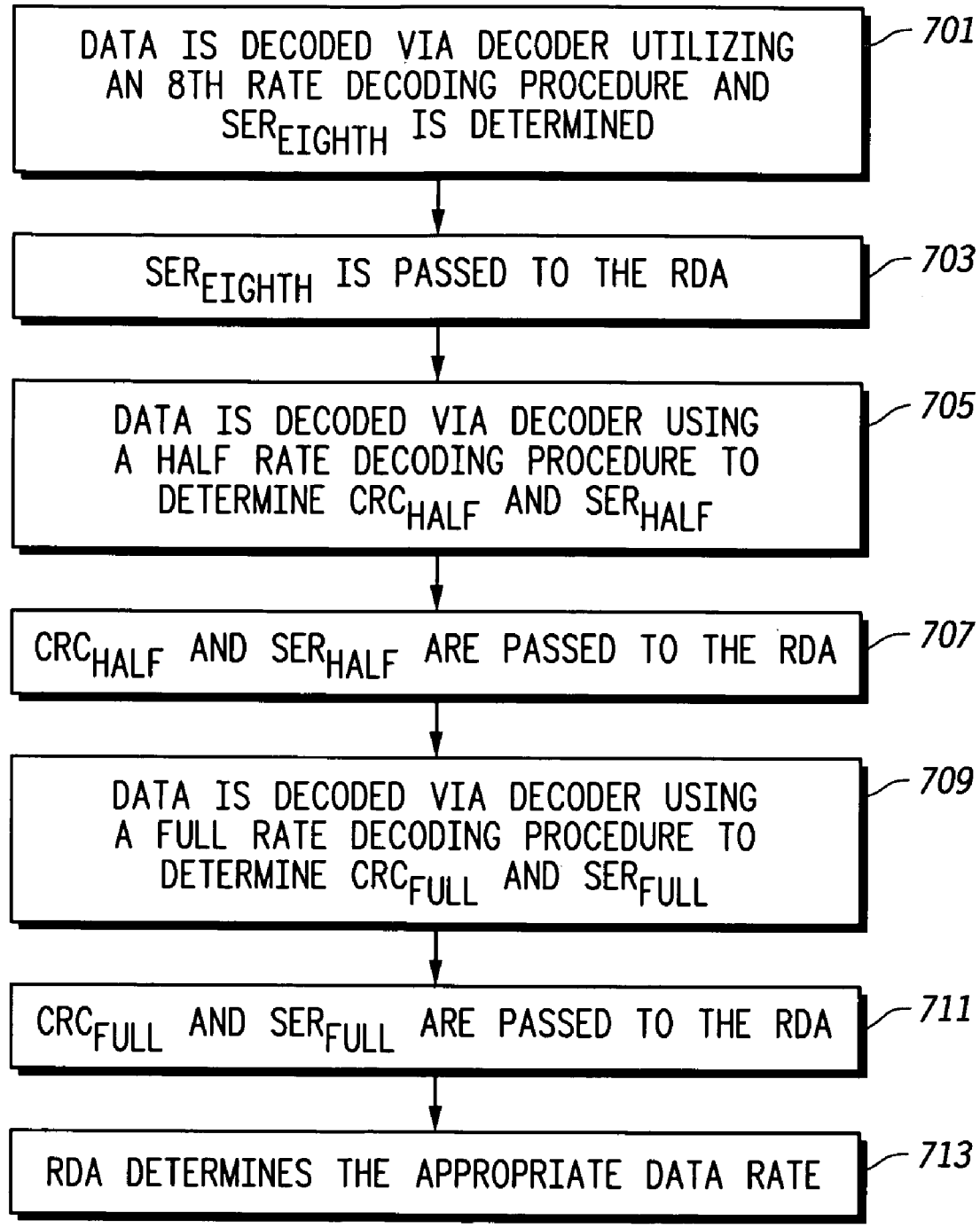
FIG. 7 is a flow chart showing operation of the decoder of FIG. 3 in accordance with the preferred embodiment of the present invention.

FIG. 7 is a flow chart showing operation of convolutional decoder 300 of FIG. 3 in accordance with the preferred embodiment of the present invention. The logic flow begins at step 701 where the data is decoded via decoder 311 utilizing an $8^{th}$ rate decoding procedure and $SER_{eighth}$ is determined. In particular, decoder 311 uses a Trellis diagram with a first beginning state and a first ending state (e.g. 10101011) to determine $SER_{eighth}$. At step 703 $SER_{eighth}$ is passed to the RDA. At step 705 the data is decoded via decoder 307 using a half rate decoding procedure to determine $CRC_{half}$ and $SER_{half}$. In particular, a Trellis diagram is utilized with a second beginning state and a second ending state (e.g., 01100110) to determine $CRC_{half}$ and $SER_{half}$. At step 707 $CRC_{half}$ and $SER_{half}$ are passed to the RDA. At step 709 the data is decoded via decoder 305 using a full-rate decoding procedure to determine $CRC_{full}$ and $SER_{full}$. In particular, a Trellis diagram is utilized with a third beginning state and a third ending state utilized for full rate only (e.g., 01010111) to determine $CRC_{full}$ and $SER_{full}$. At step 711 $CRC_{full}$ and $SER_{full}$ are passed to determiner 313. At step 713 determiner 313 uses an RDA determines the appropriate data rate.

While the invention has been particularly shown and described with reference to a particular embodiment, it will be understood by those skilled in the art that various changes in form and details may be made therein without departing from the spirit and scope of the invention. For example, the above-described encoders/decoders may exist in both infrastructure equipment (e.g., base stations) or mobile units. Additionally, different RDAs may be utilized to determine data rates. Finally, although the preferred embodiment of the present invention was described above with a different initial state for all possible data rates, one may choose to have initial states differing for less than all of the possible frame rates. It is intended that such changes come within the scope of the following claims.

The invention claimed is:

1. A method for encoding data within a communication system, the method comprising the steps of:
   receiving a data rate; and
   setting an initial state of a convolutional encoder from a set of at least two allowable initial states based on the data rate, wherein at least one initial state of the at least two allowable initial states is a non-zero state.

2. The method of claim 1 wherein the step of receiving the data rate comprises the step of receiving a data rate from the group consisting of full, ½, ¼, and ⅛$^{th}$ rate.

3. The method of claim 1 wherein the step of setting the initial state of the convolutional encoder based on the data rate comprises the step of setting an initial state of the encoder that is different for all possible data rates.

4. The method of claim 1 further comprising the step of encoding data with the convolutional encoder based on the data rate.

5. A method for decoding data within a communication system, the method comprising the steps of:
   receiving data;
   setting an initial state of a Trellis diagram from a set of at least two allowable initial states based on a data rate, wherein at least one initial state of the at least two allowable initial states is a non-zero state; and
   utilizing the Trellis diagram to decode the data.

6. The method of claim 5 further comprising the step of setting a final state of the Trellis diagram based on the data rate.

7. The method of claim 5 wherein the step of receiving the data comprises the step of receiving data having a frame rate from the group consisting of full, ½, ¼, and ⅛$^{th}$ rate.

8. The method of claim 5 wherein the step of setting the initial state of the Trellis diagram based on the data rate comprises the step of setting an initial state of the Trellis diagram that is different for all possible data rates.

9. The method of claim 5 further comprising the step of passing decoding characteristics to a Rate Determining Algorithm (RDA).

10. A convolutional encoder comprising:
    means for receiving a data rate; and
    means for determining an initial state of the encoder from a set of at least two allowable initial states based on the data rate, wherein at least one initial state of the at least two allowable initial states is a non-zero state.

11. The convolutional encoder of claim 10 wherein the rate is a frame rate.

12. The encoder of claim 11 wherein the frame rate is a frame rate from the group consisting of Full, ½, ¼, and ⅛$^{th}$ rate frames.

13. The encoder of claim 12 wherein the initial state is different for all possible rates.

14. An apparatus comprising:
    means for receiving data; and
    means for decoding the received data utilizing a Trellis diagram having an initial and a final state based on a transmission rate, wherein the initial state of the Trellis diagram is one of at least two allowable initial slates and wherein at least one initial state of the at least two allowable initial states is a non-zero state.

15. The apparatus of claim 14 wherein the transmission rate is a frame rate.

16. The apparatus of claim 15 wherein the frame rate is a frame rate from the group consisting of Full, ½, ¼, and ⅛$^{th}$ rate frames.

17. The apparatus of claim 16 wherein the initial state is different for all possible rates.

* * * * *